(12) United States Patent
Choi

(10) Patent No.: US 7,366,052 B2
(45) Date of Patent: Apr. 29, 2008

(54) MEMORY DEVICE, MEMORY SYSTEM AND METHOD OF INPUTTING/OUTPUTTING DATA INTO/FROM THE SAME

(75) Inventor: Joo-Sun Choi, Yongin-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 11/582,290

(22) Filed: Oct. 17, 2006

(65) Prior Publication Data

US 2007/0097753 A1    May 3, 2007

(30) Foreign Application Priority Data

Oct. 31, 2005    (KR) ..................... 10-2005-0103221

(51) Int. Cl.
*G01C 8/00* (2006.01)
(52) U.S. Cl. ................ 365/233; 365/149; 365/189.05
(58) Field of Classification Search ............... 365/149, 365/189.05, 233
See application file for complete search history.

(56) References Cited

U.S. PATENT DOCUMENTS 6,260,128 B1 *   7/2001   Ohshima et al. ............ 711/169
6,978,389 B2 *  12/2005   Jahnke ....................... 713/322

* cited by examiner

*Primary Examiner*—Hoai V. Ho
(74) *Attorney, Agent, or Firm*—F. Chau & Assoc., LLC

(57) ABSTRACT

A memory device includes a memory cell array, a row decoding section, a K-bit prefetch section and an output buffer section. The row decoding section decodes a row address in response to a first clock, to activate one of the word lines corresponding to the decoded row address. The K-bit prefetch section decodes a column address in response to a second clock and prefetches K data from K memory cells connected to the activated word line and corresponds to the decoded column address, in response to a second clock, where a frequency of the second clock is 1/M of that of the first clock. The output buffer section outputs the K prefetched data as a data stream in response to a third clock. Therefore, a burden from the physical limit of the access speed may be alleviated when the data I/O speed is increased.

20 Claims, 10 Drawing Sheets

FIG. 4

| | ARRAY ACCESS SPEED | I/O SPEED | NUMBER OF PRE-FETCH | MINIMUM BURST LENGTH |
|---|---|---|---|---|
| SDRAM | 100~200MHz | 100~200MHz | 1 | 1 |
| DDR | 100~200MHz | 200~400MHz | 2 | 2 |
| DDR2 | 100~200MHz | 400~800MHz | 4 | 4 |
| DDR3 | 100~200MHz | 800~1600MHz | 8 | 8 |
| NEXT DRAM (DIFFERENTIAL I/O) | 100~200MHz | 3200~6400MHz | 32 | 32 |

MEMORY DEVICE, MEMORY SYSTEM AND METHOD OF INPUTTING/OUTPUTTING DATA INTO/FROM THE SAME

CROSS-REFERENCE TO RELATED APPLICATION

This application claims the benefit under 35 U.S.C. § 119(a) of Korean Patent Application No. 2005-103221 filed on Oct. 31, 2005, the contents of which are herein incorporated by reference in its entirety.

BACKGROUND OF THE INVENTION

1. Technical Field

The present disclosure relates to a memory device, a memory system and a method of inputting/outputting data into/from the memory device.

2. Discussion of the Related Art

FIG. 1 is a, conceptual diagram illustrating a data input/output operation of a conventional synchronous dynamic random access memory (SDRAM).

Referring to FIG. 1, data are transferred from/to the conventional SDRAM 10 *once in one period of an external clock. When a frequency of the external clock for input/output of data is 100 MHz, a frequency of an array access clock to access a memory cell array inside the. SDRAM is also 100 MHz, identical to that of the external clock.

In FIG. 1, when a toggling rate for a DQ pin that indicates a data input/output (I/O) speed of a DRAM is as low as 100 Mbps, a frequency of the external clock signal may be configured to be the same as the data I/O speed.

As the data I/O speed required by the memory system becomes faster, a double data rate (DDR) memory device has been developed. This device doubles the data I/O speed in a way that data are respectively transferred at both a rising edge and a falling edge of one period of a memory internal clock. The DDR memory also adapts to a prefetch technique.

FIG. 2 is a conceptual diagram illustrating a data I/O operation of a conventional DDR memory.

When row lines are accessed, the DDR memory 20 latches data from memory cells, at sense amplifiers that are attached to each of the row lines. The prefetch technique transfers every two of the data of the memory cells of the respective row lines through multiple data paths at the same time, instead of conventionally transferring the data of one of the memory cells of the respective row lines through one data path.

For example, the DDR memory 20 may include internally a plurality of parallel data paths operating with a 100 MHz frequency access clock to access a memory cell array. At a data I/O circuit, the DDR memory outputs each data output of the plurality of parallel data paths through each DQ pin, synchronized with a 200 MHz frequency clock. As a result, the speed of data I/O is increased by two times.

Exemplary cases of including two, four and eight parallel data paths are respectively referred to as 2-bit prefetch, 4-bit prefetch and 8-bit prefetch. A burst length, which is a minimum number of data transferred at the same time for one read command or one write command, corresponds to two, four and eight for the respective prefetch cases.

FIG. 3 is a conceptual diagram illustrating a data I/O operation of a conventional Rambus dynamic random access memory (RDRAM) 30. The RDRAM 30 uses the 8-bit prefetch technique and the data I/O speed of the RDRAM is eight times greater than a frequency of the memory cell array access clock.

When eight DRAMs having x8 I/O pins constitute one memory module, a memory controller may be connected with the memory module by a 64-bit, that is, 8 bytes, system bus.

If single data rate (SDR) memory devices are mounted on the memory module, 8 bytes of data are transferred through the system bus at one read command or one write command, because the burst length, which is a minimum unit of data transferred according to a given column address, is one. A DDR memory adapting the 2-bit prefetch technique transfers 16 bytes through the system bus at one read command or one write command, because the burst length is two: a DDR2 memory adapting the 4-bit prefetch technique transfers 32 bytes (a burst length 4) and a DDR3 memory adapting the 8-bit prefetch technique transfers 64 bytes (a burst length 8).

FIG. 4 is a table showing a range of typical data I/O speed and access speed of the memory cell array according to the conventional SDR, DDR, DDR2, DDR3 memory devices.

Referring to FIG. 4, a data I/O speed is 2n times greater than an access speed to a memory cell array of a DRAM, where n denotes a number of prefetched bits. For example, for the DDR3 memory with the 8-bit prefetch technique, the access speed to the memory cell array is ranged from about 100 to 200 MHz, and the data I/O speed is ranged from about 800 to 1600 MHz, which is eight times greater than the access speed to the memory cell array.

FIG. 5 is a block diagram illustrating a configuration of an 8-bit prefetch DDR3 memory device. FIG. 6 is a timing diagram of a data read operation of the 8-bit prefetch DDR3 memory device in FIG. 5. An external clock CLK1 is about 400 MHz, an access clock CLK21 to a memory cell array is about 100 MHz, and the data I/O data clock CLK is about 800 MHz, in the circuit shown in FIG. 5.

The 100 MHz access clock CLK21 may be generated by dividing an external clock, for example, a 400 MHz clock, by four using a frequency divider 505a. The 800 MHz data I/O clock CLK3 may be generated by multiplying the external clock CLK1 by two using a frequency multiplier 583.

Referring to FIG. 5, the 8-bit prefetch DDR3 memory includes an address buffer 501, a row latch 503, a row decoding section 510, a column latch 507, a prefetch section 550, a memory cell array 520, a bitline sense amplifier section 530, a column select section 540, an output buffer section 560 and a data pin (DQ) 581. An address path and a data output path are illustrated in FIG. 5, however, a command path and a data input path are not illustrated in FIG. 5.

The 400 MHz external clock CLK1 is applied to the row latch 503 and a row predecoder 511, and the 100 MHz access clock CLK21 is applied to the column latch 507 and a column predecoder 521. The data I/O clock CLK3 is applied to each latch 561 in the output buffer section 560.

After an address ADDR is inputted into the memory device, a row address in the address ADDR that is transferred through the address buffer 501 is latched at the row latch 503 in synchronization with the external clock CLK1 to be decoded at the row decoding section 510, which includes the row predecoder 511 and a row decoder 513. A column address in the address ADDR is latched at the column latch 507 in synchronization with the access clock CLK21, and then is decoded at a column predecoder 551 and a column decoder 553 in the prefetch section 550 in synchronization with the access clock CLK21.

When a read command READ is activated and a row line according to the row address is activated, data on memory cells connected to the activated row line are latched at the bitline sense amplifier section 530. A column line in the column select section 540 corresponding to the column address is activated and the data latched at the bitline sense amplifier section 530 are transferred through the data I/O lines.

The data from the data I/O lines are respectively amplified by I/O sense amplifiers 555, synchronized with the data I/O clock CLK3, to be latched at respective ones of the latches 561 and finally to be output via an output buffer 563 and the DQ pin 581.

Referring to FIGS. 5 and 6, the 8-bit prefetch technique shown in conjunction with the circuit of FIG. 5, transfers eight data D0 through D7 of the memory cell sharing one row line to eight data paths, synchronized with the access clock CLK21 of the memory cell array. For example, the 8-bit prefetch DDR3 memory device has eight parallel data paths to respectively access the memory cell array with the 100 MHz access clock CLK21, and to output respective output data D0 through D7 of the eight parallel data paths through the data I/O circuit and the DQ pin with the 800 MHz data I/O clock CLK3.

FIG. 7 is a block diagram illustrating a configuration of a 4-bit prefetch DDR3 memory device. FIG. 8 is a timing diagram of data read operation of the 4-bit prefetch DDR3 memory device in FIG. 7.

In FIG. 7, the 8-bit prefetch configuration of the DDR3 shown in FIG. 5 is replaced with a 4-bit prefetch configuration maintaining the same data I/O speed. For example, in FIG. 7, an access clock to a memory cell array is increased so as to be two times faster than the access clock used in FIG. 5 and the eight parallel data paths to prefetch are used instead of the four parallel data paths used in FIG. 5.

Similar to the 8-bit prefetch DDR3 memory device in FIG. 5, the external clock is about 400 MHz and the data I/O speed is about 800 MHz for a memory with the 4-bit prefetch technique. An access speed CLK22 to the memory cell array is two times greater than the access speed CLK21 of the 8-bit prefetch DDR3 memory device in FIG. 5. The 200 MHz access clock CLK22 may be generated by dividing the external clock CLK1 by two by a frequency divider 505b.

Referring to FIGS. 7 and 8, the 4-bit prefetch technique used in the circuit of FIG. 7 delivers four data D0 through D3 from the memory cell, sharing one row line, to four data paths, in synchronization with the 200 MHz access clock CLK22. Subsequently, the next four data D4 through D7 of the memory cell, sharing the row line, are delivered to the four data paths, in synchronization with the following pulse of the 200 MHz access clock CLK22.

The 4-bit prefetch DDR memory device has four parallel data paths to access respectively the memory cell array with the 200 MHz access clock CLK22, and to prefetch the respective output data D0 through D7 in of prefetching four data at a time. The respective output data D0 through D7 of the four parallel data paths are outputted through the data I/O circuit and the DQ pin with the 800 MHz data I/O clock CLK3.

While the 8-bit prefetch DDR memory device prefetches the eight data using the 100 MHz access clock CLK21 to output the eight data at 800 Mbps through the DQ pin, the 4-bit prefetch DDR memory device prefetches the four data using the 200 MHz access clock CLK22 two times in succession to output two groups of the four data at 800 Mbps through the DQ pin.

To increase the data I/O speed of the memory device, either the access clock speed or the number of the prefetched data must be increased.

When the 4-bit prefetch configuration is used, instead of the 8-bit prefetch configuration for the same data I/O speed of the DDR3 memory device, the access clock speed may be in the range from about 200 to 400 MHz. The conventional memory core architecture, however, can hardly provide such a fast access to the memory cell array.

In the conventional memory operation, the data I/O speed is 2n times faster than the access speed to a memory cell array, as shown in FIG. 4. It is difficult to make the access speed exceed a certain level with the conventional DRAM fabrication technologies. Therefore, the minimum number of the prefetched data is increased so as to improve the speed of the data I/O, because the access clock speed is physically limited.

SUMMARY OF THE INVENTION

Exemplary embodiments of the present invention provide a memory device capable of increasing the data I/O speed while using conventional DRAM fabrication technologies.

Exemplary embodiments of the present invention provide a memory system including memory devices capable of increasing the data I/O speed while using conventional DRAM fabrication technologies.

Also, exemplary embodiments of the present invention provide a method of data I/O with improved speed.

In exemplary embodiments of the present invention, a memory device includes a memory cell array, a row decoding section, a K-bit prefetch section and an output buffer section. The memory cell array includes a plurality of word lines, a plurality of column lines and a plurality of memory cells. The row decoding section decodes a row address in response to a first clock, to activate one of the word lines corresponding to the decoded row address. The K-bit prefetch section decodes a column address in response to a second clock and prefetches K data from K memory cells of the plurality of memory cells that are connected to the activated word line and correspond to the decoded column address, in response to the second clock to access the memory cell array, wherein a frequency of the second clock is 1/M of a frequency of the first clock, M is a real number other than a 2's power and K is a natural number equal to or greater than 2. The output buffer section outputs the K prefetched data as a data stream in response to a third clock.

In exemplary embodiments, M may be determined so that the frequency of the second clock is lower than a physical clock limit used to access the memory cell array. Furthermore, the memory device may be one of a DDR memory device, a DDR2 memory device and a DDR3 memory device.

In exemplary embodiments of the present invention, a memory system includes a memory module having a plurality of memory devices and a memory controller transferring commands and addresses to the plurality of memory devices, and transferring or receiving data from/to the plurality of memory devices. Each of the memory devices includes the above-described configuration of the memory device.

In exemplary embodiments of the present invention, a method of data input/output of the memory device includes activating a word line corresponding to a decoded row address decoded from a row address in response to a first clock; prefetching K data from memory cells connected to the activated word line, corresponding to a decoded column address decoded from a column address, in response to a second clock to access the memory cell array, wherein a frequency of the second clock is 1/M of a frequency of the first clock, M is a real number other than a 2's power and K is a natural number equal to or greater than 2; and outputting the K data as a data stream in response to a third clock. Furthermore, M may be determined so that the frequency of the second clock is lower than a physical clock limit to access the memory cell array.

BRIEF DESCRIPTION OF THE DRAWINGS

Exemplary embodiments of the present invention will be understood in more detail from the following descriptions taken in conjunction with the accompanying drawings, in which:

FIG. 4 is a table showing a range of typical data I/O speed and access speed of the memory cell array according to the conventional SDR, DDR, DDR2, and DDR3 memory devices;

DESCRIPTION OF EXEMPLARY EMBODIMENTS

Figure 1:
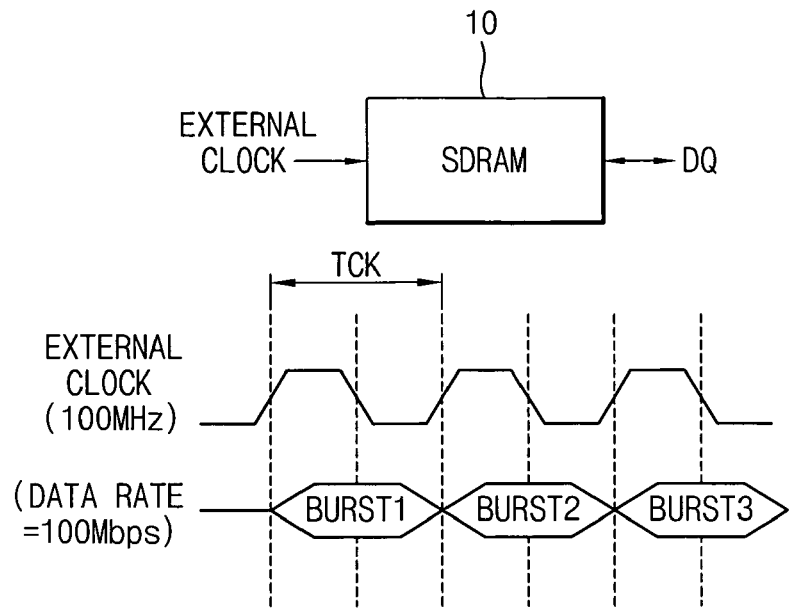
FIG. 1 is a conceptual diagram illustrating a data input/output operation of a conventional synchronous dynamic random access memory (SDRAM)
Figure 2:
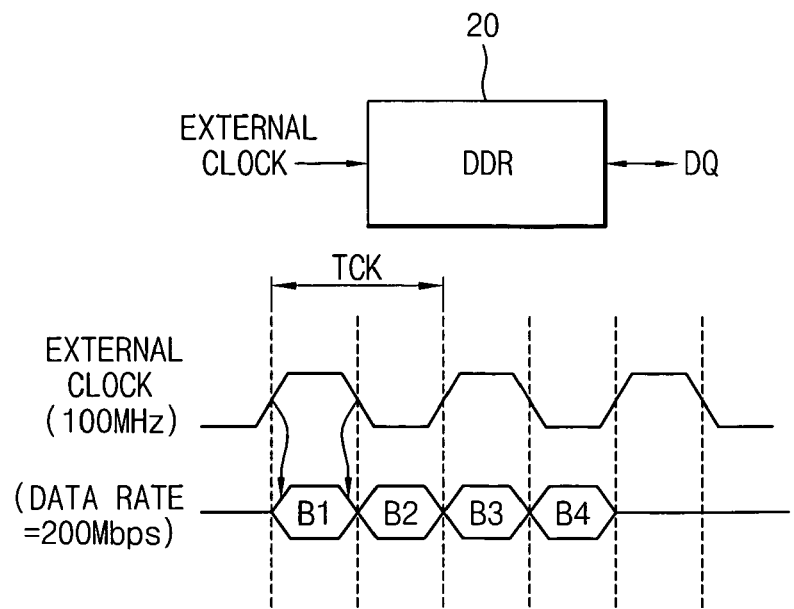
FIG. 2 is a conceptual diagram illustrating a data I/O operation of a conventional DDR memory.
Figure 3:
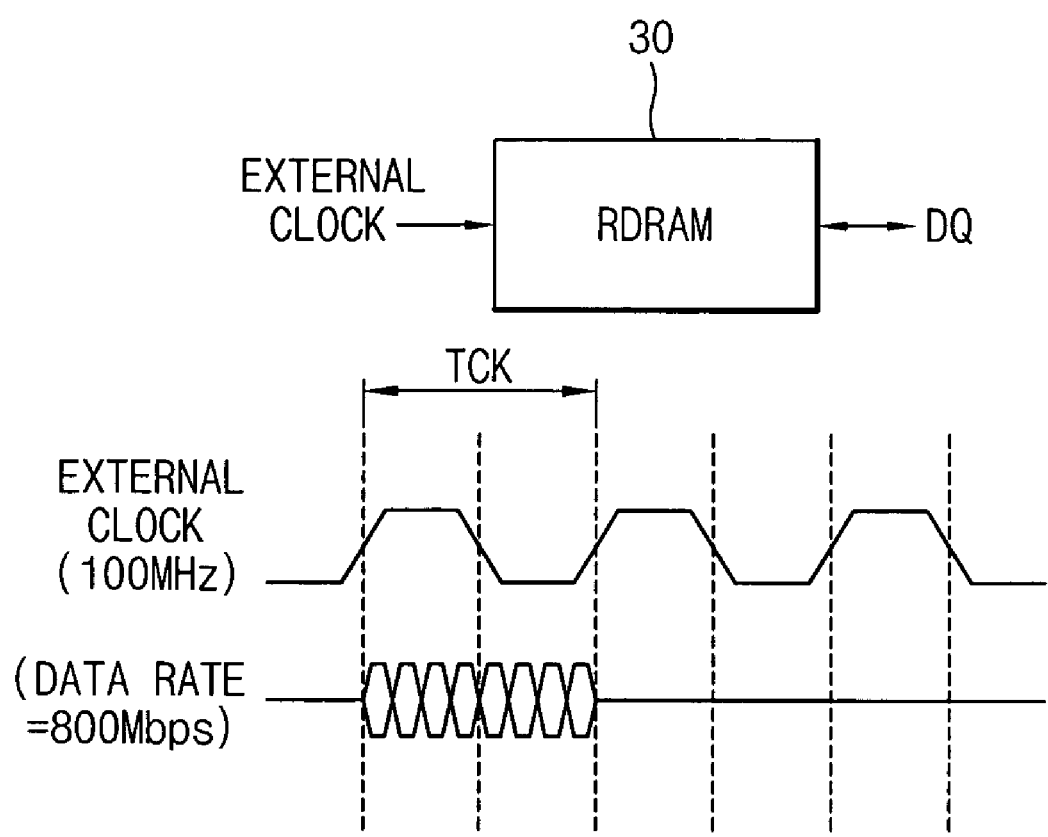
FIG. 3 is a conceptual diagram illustrating a data I/O operation of a conventional Rambus dynamic random access memory (RDRAM)
Figure 5:
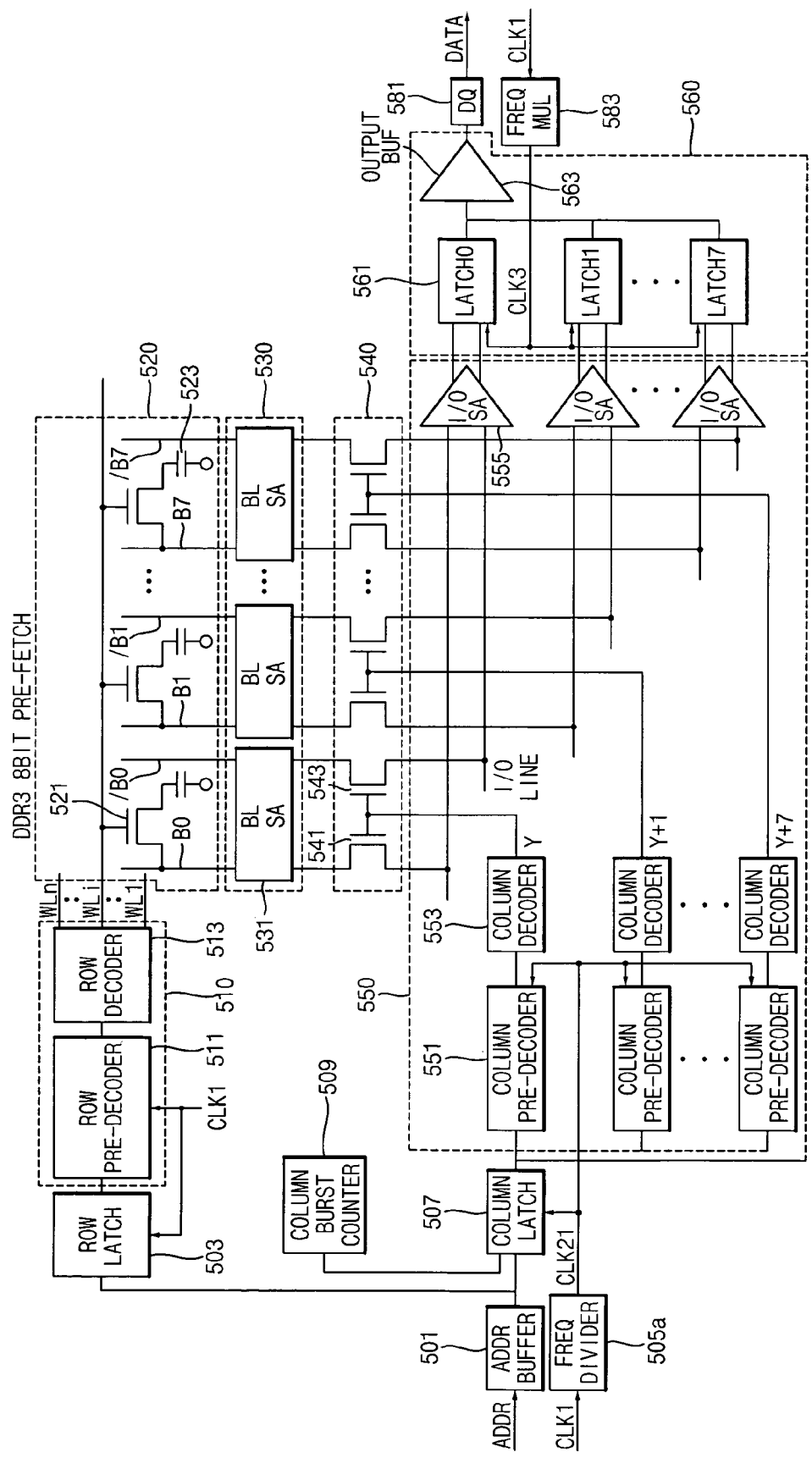
FIG. 5 is a block diagram illustrating a configuration of an 8-bit prefetch DDR3 memory device.
Figure 6:
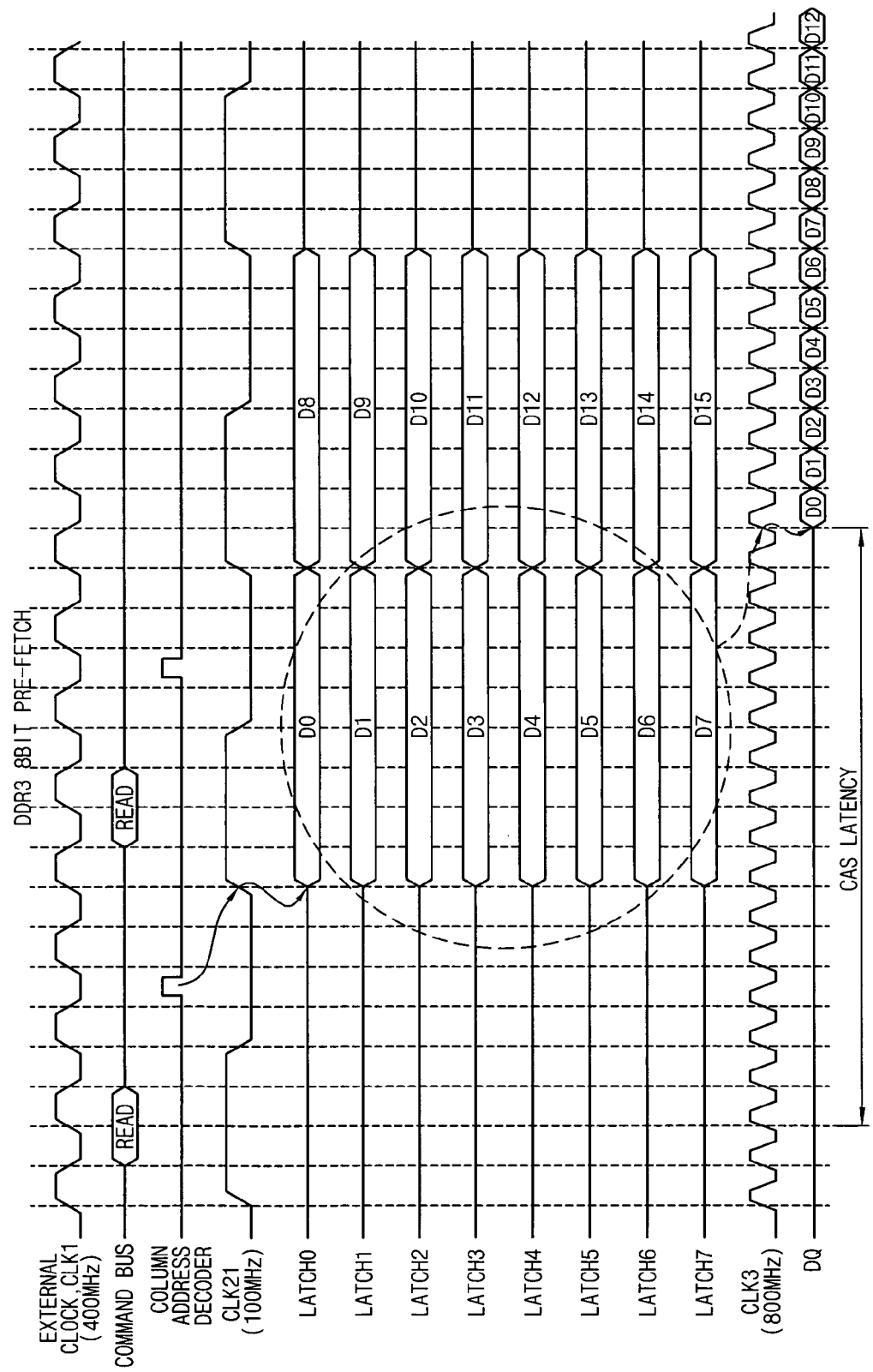
FIG. 6 is a timing diagram of data read operation of the 8-bit prefetch DDR3 memory device in FIG. 5.
Figure 7:
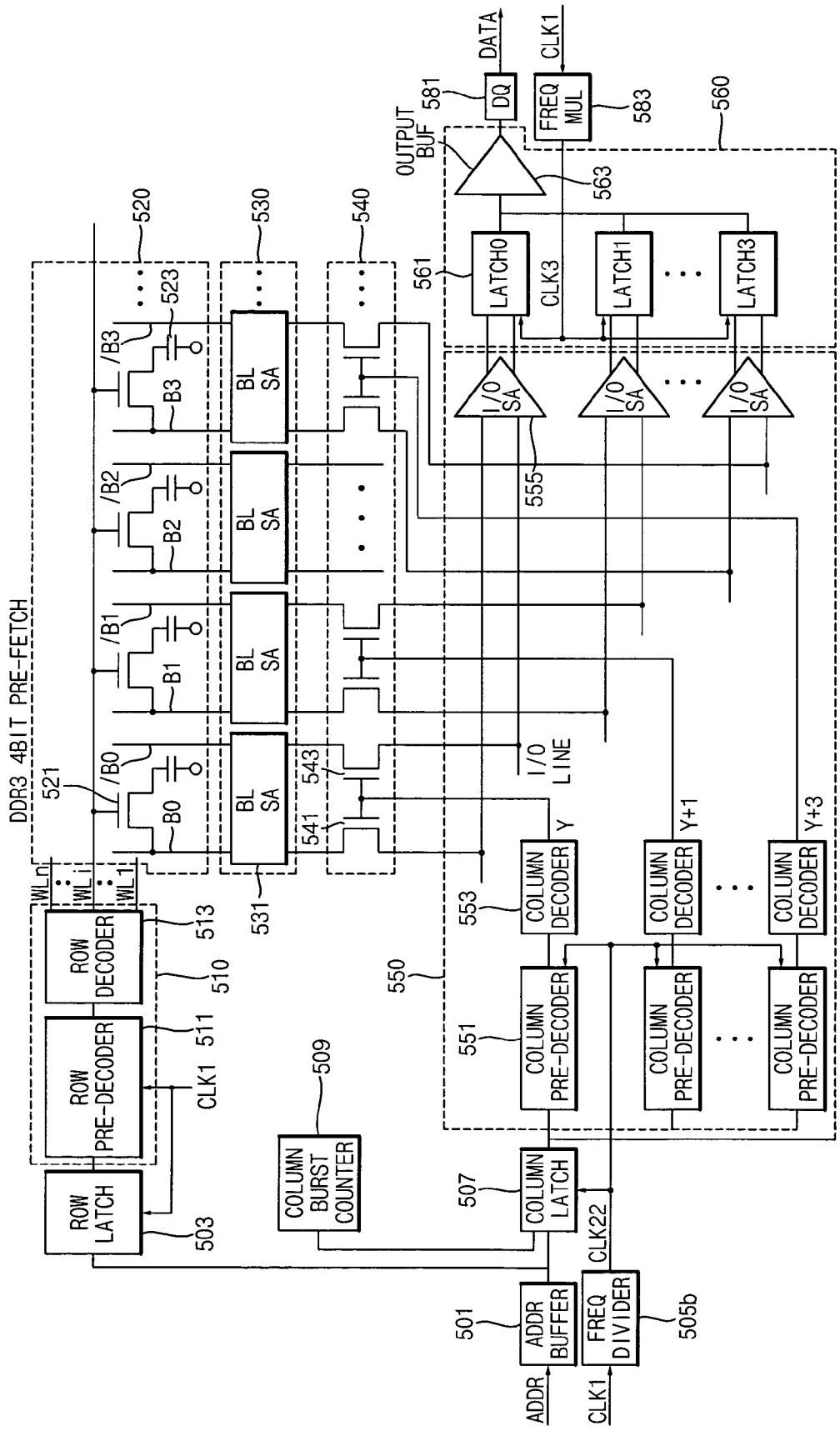
FIG. 7 is a block diagram illustrating a configuration of a 4-bit prefetch DDR3 memory device.
Figure 8:
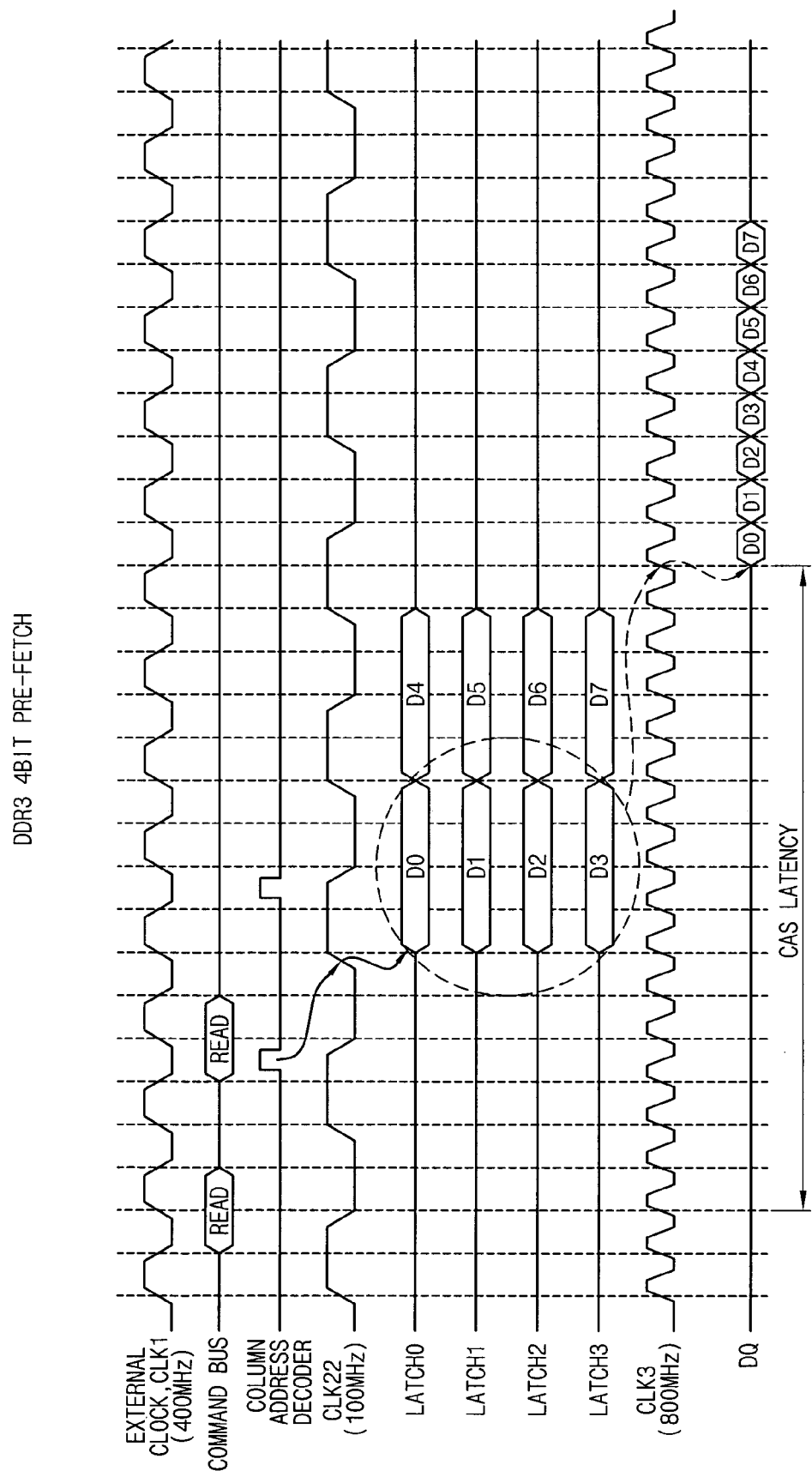
FIG. 8 is a timing diagram of data read operation of the 4-bit prefetch DDR3 memory device in FIG. 7.
Figure 9:
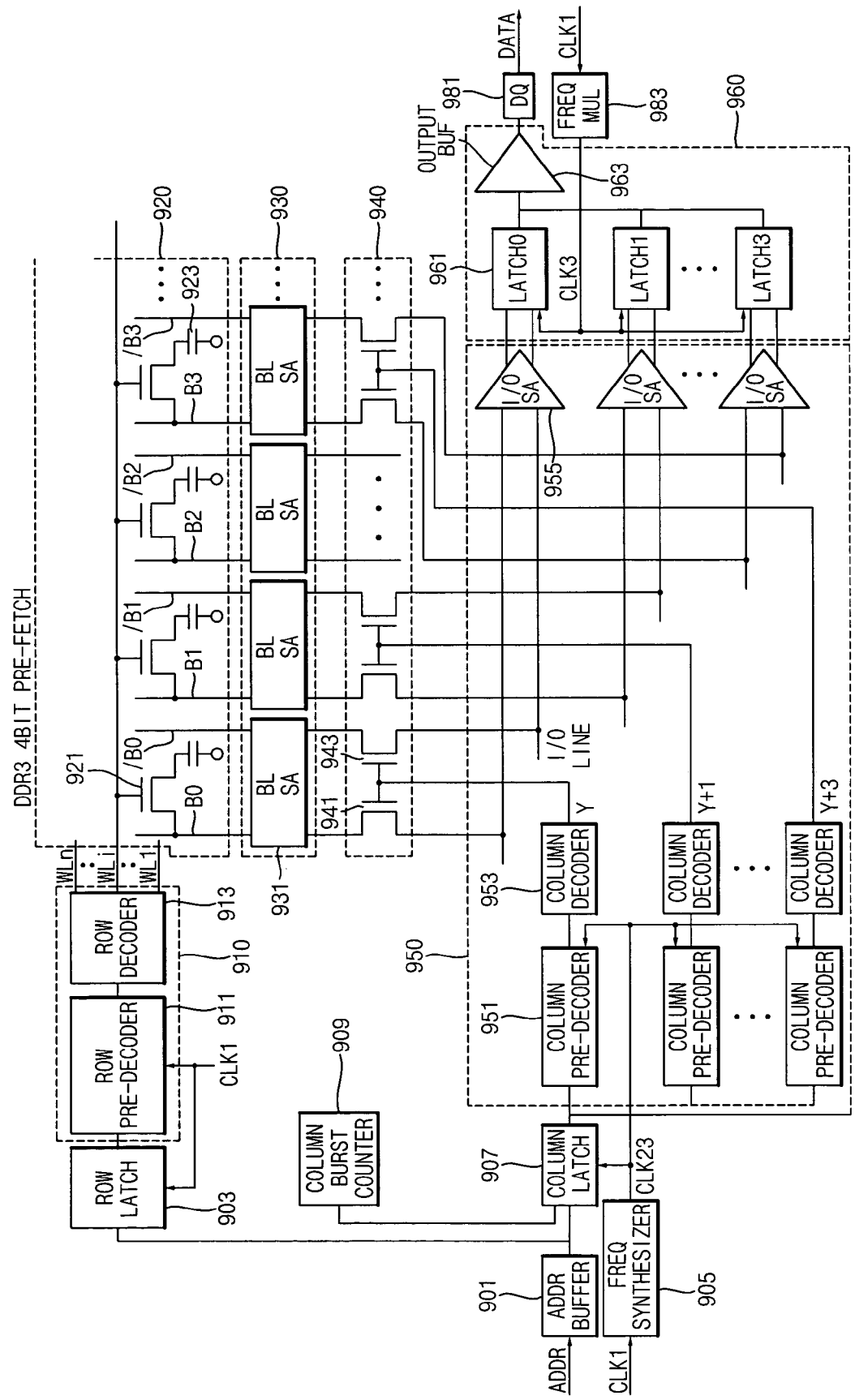
FIG. 9 is a block diagram illustrating a configuration of internal blocks of a 4-bit prefetch DDR3 memory device according to an exemplary embodiment of the present invention.
Figure 10:
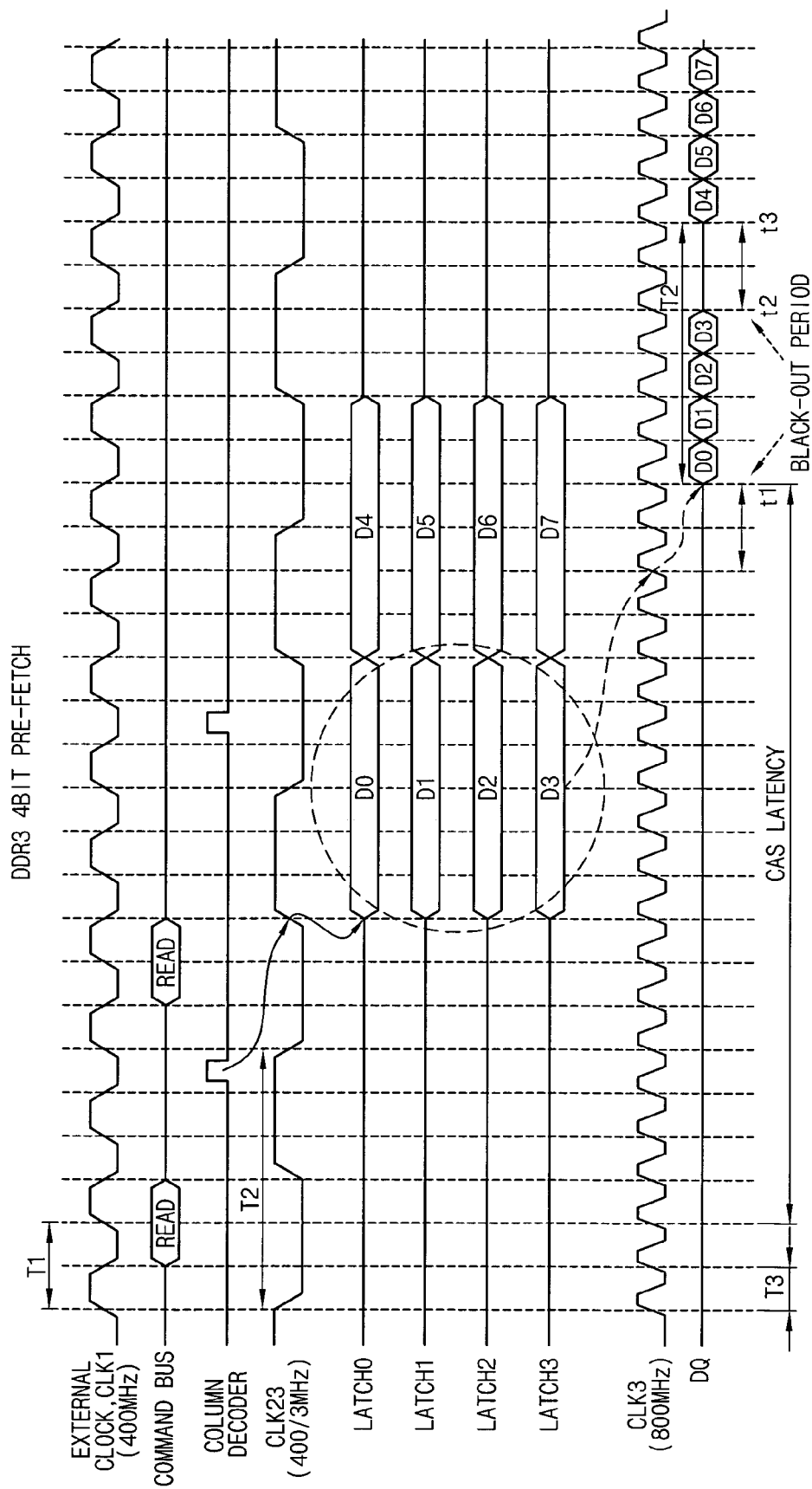
FIG. 10 is a timing diagram for a reading operation of the 4-bit prefetch DDR3 memory device shown in FIG. 9.

FIG. 9 is a block diagram illustrating a configuration of a 4-bit prefetch DDR3 memory device according to an exemplary embodiment of the present invention. FIG. 10 is a timing diagram for a reading operation of the 4-bit prefetch DDR3 memory device shown in FIG. 9.

In FIG. 9, an external clock CLK1 is about 400 MHz, an access clock CLK23 to a memory cell array is about CLK1/M MHz, and a data I/O clock CLK3 is about 800 MHz.

A frequency synthesizer 905 converts an external clock CLK1, for example, 400 MHz, to a desired frequency to generate the access clock CLK23. The frequency synthesizer 905 may determine the desired frequency based on burst length information.

M may be determined to be a value with which a frequency of the access clock CLK23 is maintained lower than a physical clock limit to access the memory cell array. M may be a real number other than a power of 2. For example, M may be a natural number, such as 3, 5, 6, 7, etc., which can not be obtained as a power of 2. M may be a value obtained by dividing a natural number other than a power number by 2, such as 3/2, 5/2, 6/2, 7/2, etc. Alternatively, M may be a value obtained by dividing a natural number other than a power number by 4, such as 3/4, 5/4, 6/4, and 7/4.

A frequency multiplier 983 multiplies by two times the external clock CLK1 fed thereto to generate the data I/O clock CLK3. The frequency of the access clock CLK23 from the frequency synthesizer 905 may be CLK3/L MHz, where L is a real number other than powers of 2. For example, L is 3/2 when the data I/O clock is 800 MHz.

Referring to FIG. 9, the 4-bit prefetch DDR3 memory device according to an exemplary embodiment of the present invention includes an address buffer 901, a row latch 903, a row decoding section 910, a column latch 907, a prefetch section 950, a memory cell array 920, a bitline sense amplifier section 930, a column select section 940, an output buffer section 960 and a data pin (DQ) 981. The prefetch section 950 includes four data paths. Each of the data paths includes a column predecoder 951, a column decoder 953 and an I/O sense amplifier 955.

FIG. 9 illustrates an address path and a data output path during a data read operation. A command path and a data input path are omitted because they are substantially identical to those of the conventional DDR memory devices.

The external clock CLK1 of 400 MHz frequency is applied to the row latch 903 and the row predecoder 911, and the access clock CLK23 of 400/3 MHz frequency is applied to the column latch 907 and the column predecoder 951. The access clock CLK23 may also be applied to the column decoder 953. The data I/O clock CLK3 is applied to respective ones of the latches 961 in the output buffer section 960.

Although FIG. 9 illustrates the column latch 907 connected via the column predecoder 951 to the column decoder 953, the column latch 907 may be directly connected to the column decoder 953. Similarly, although FIG. 9 illustrates the row latch 903 connected via the row predecoder 911 to the row decoder 913, the row latch 903 may be directly connected to the row decoder 913.

Referring to FIGS. 9 and 10, an address ADDR is inputted into the memory device. A row address in the address ADDR, transferred through the address buffer 901, is latched at the row latch 903 in synchronization with the external clock CLK1 so as to be decoded at the row decoding section 910, which includes the row predecoder 911 and the row decoder 913. A column address in the address ADDR, transferred through the address buffer 901, is latched at the column latch 907 in synchronization with the external clock CLK1, and then is decoded at the column predecoder 951 and the column decoder 953 in the prefetch section 950, in synchronization with the external clock CLK1.

When a read command READ is activated and a row line is activated by the row address in the address ADDR, data D0, D1, D2, D3 on memory cells connected to the activated row line are latched at the bitline sense amplifier section 930.

The column predecoder 951 executes a predecoding operation with the column address in response to the access clock CLK23, so as to obtain information about a memory block among a plurality of memory blocks, which corresponds to the column address.

The column decoder 953 outputs a column select signal according to the predecoded column address. Column lines in the memory block are selected by the column select signal, and the data D0, D1, D2, D3 latched in the bitline sense amplifier section 930 corresponding to the selected column lines are outputted through the data I/O lines.

The I/O sense amplifiers 955 respectively amplify signals of the data D0, D1, D2, D3 on the data I/O lines. The data D0, D1, D2, D3 are latched at each one of the latches 961 synchronized with the data I/O clock CLK3, and then are output via the output buffer 963 to the DQ pin 981.

Next, subsequent data D4, D5, D6, D7 of the memory cells connected to the activated row line are latched at the each one of the latches 961, in synchronization with the following pulse of the access clock CLK23, and then are output via the output buffer 963 to the DQ pin 981.

The 4-bit prefetch configuration shown in FIG. 9 transfers two groups of four data D0 through D3 and D4 through D7 of the memory cell, which shares one row line, to four data paths in synchronization with the access clock CLK23. The 4-bit prefetch DDR memory device has internally four parallel data paths to access respectively the memory cell array with the access clock CLK23 of 400/3 MHz frequency. The respective successive data group D0, D1, D2, D3 and D4, D5, D6, D7 of the four parallel data paths are subsequently output through the DQ pin with the data I/O clock CLK3 of 800 MHz frequency.

A black-out period in FIG. 10 is obtained by the following expression 1.

$$\text{Black-out period}=t3-t2=(t3-t1)-(t2-t1)=T2-BL\times T3, \quad \text{<Expression 1>}$$

where T2 denotes a period of the access clock CLK23, BL denotes a burst length, and T3 denotes a period of the data I/O clock CLK3.

A time interval between t3 and t1 is substantially equal to one period T1 of the access clock CLK23.

Although FIGS. 9 and 10 take an example of a 4-bit prefetch DDR3 memory device, exemplary embodiments of the present invention may be easily applied to an 8-bit prefetch scheme, as well as to a 16-bit prefetch scheme and a 32-bit prefetch scheme.

For example, for a 4-bit prefetch DDR3 memory device having an 800 Mbps data I/O speed and an access clock CLK23 of 400/5 MHz (the 400 MHz external clock CLK1 and M=5) may use the 4-bit prefetch scheme with a differential signaling technique in order to increase the data I/O speed two times, or, 1.6 Gbps, in a manner of doubling the speed of the access clock 2×400/5 MHz, or, M=5/2. The frequency of the access clock is about 160 MHz, which is kept lower than that of the physical clock limit to access the memory cell array.

Figure 11:
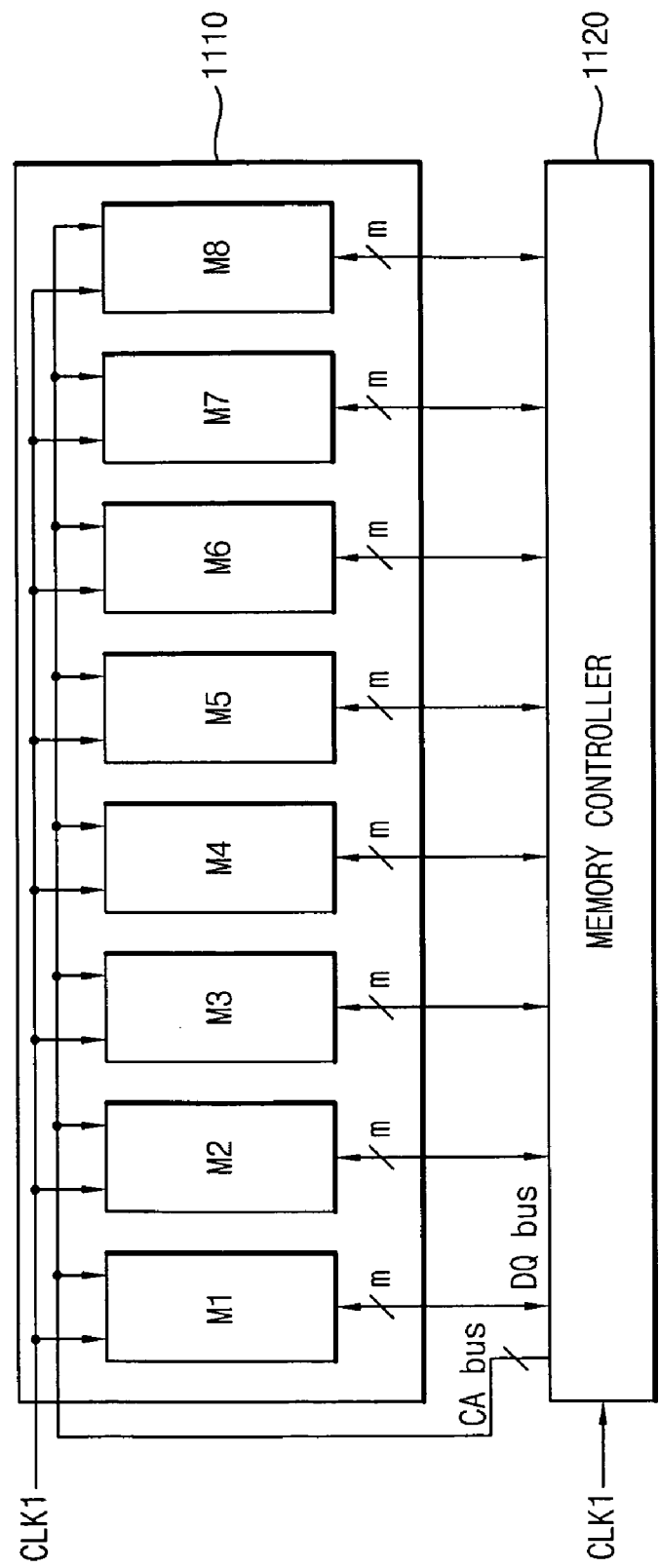
FIG. 11 is a block diagram illustrating a memory system according to an exemplary embodiment of the present invention.

FIG. 11 is a block diagram illustrating a memory system according to an exemplary embodiment of the present invention. FIG. 11 exemplarily illustrates a memory module 1110 having eight memory devices M1 through M8. It will be understood, however, that the present invention is not limited to such a relationship.

The memory devices M1 to M8 shown in FIG. 11 may respectively have schemes like those illustrated in FIG. 9. Referring to FIG. 11, an external clock CLK1 is applied to each of the memory devices M1 to M8 and to a memory controller 1120. The memory controller 1120 transfers commands and addresses via a CA bus to each of the memory devices M1 to M8. The memory controller 1120 also transfers and receives data from/to each of the memory devices M1 to M8 via respective ones of DQ buses.

Although FIG. 11 illustrates the memory controller 1120 connected with a plurality of memory devices using a multi-drop scheme, a memory system according to the exemplary embodiments of the present invention may also have a memory controller connected with respective memory devices using a point-to-point scheme.

Although FIG. 11 illustrates the memory controller 1120 connected with one memory module 1100, a memory system according to exemplary embodiments of the present invention may also have a memory controller connected with a plurality of the memory modules.

According to the memory device, the memory system and the data I/O technique of the memory device as described above, the frequency of the access clock may be a predetermined frequency other than a frequency having a relationship of 2n with the data I/O speed. Therefore, a burden from the physical limit of the access speed may be alleviated when the data I/O speed is increased. Additionally, exemplary embodiments of the present invention may have a minimum burst length shorter than that of the conventional schemes when the data I/O speed is increased.

The foregoing is illustrative of exemplary embodiments of the present invention and is not to be construed as limiting thereof. Although exemplary embodiments of the present invention have been described, those skilled in the art will readily appreciate that many modifications are possible without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the exemplary embodiments disclosed, and that modifications to the exemplary embodiments, are intended to be included within the scope of the appended claims. The invention is defined by the following claims, with equivalents of the claims to be included therein.

What is claimed is:

1. A memory device comprising:
   a memory cell array that includes a plurality of word lines, a plurality of column lines and a plurality of memory cells;
   a row decoding section that decodes a row address in response to a first clock to activate one of the word lines corresponding to the decoded row address;
   a K-bit prefetch section that decodes a column address in response to a second clock for accessing the memory cell array, so as to prefetch K data from K memory cells of the memory cells that are connected to the activated word line corresponding to the decoded column address, wherein a frequency of the second clock is 1/M of a frequency of the first clock, M is a real number other than a 2's power and K is a natural number equal to or greater than 2; and
   an output buffer section that outputs the K prefetched data as a data stream in response to a third clock.

2. The memory device of claim 1, wherein M is determined so that the frequency of the second clock is maintained lower than a frequency of a physical clock limit for the memory device to access the memory cell array.

3. The memory device of claim 2, wherein M is equal to 3.

4. The memory device of claim 2, wherein a frequency of the third clock is substantially equal to L times the second clock, where L is a real number other than a 2's power.

5. The memory device of claim 1, further comprising a frequency synthesizer that is configured to generate the second clock based on the first clock.

6. The memory device of claim 5, wherein the frequency synthesizer is configured to determine the frequency of the second clock, based on information of a burst length of the memory device.

7. The memory device of claim 1, further comprising a column latch that latches the column address synchronized with the second clock.

8. The memory device of claim 7, wherein the K-bit prefetch section comprises K data paths, each of the K data paths comprising:
- a predecoder that performs a predecoding operation of the column address in response to the second clock;
- a column decoder that decodes the predecoded column address; and
- an input/output (I/O) sense amplifier that amplifies data from the memory cell, connected to the activated word line, corresponding to the decoded column address.

9. The memory device of claim 1, wherein the memory device is a dynamic random access memory (DRAM).

10. The memory device of claim 9, wherein the memory device is one of a DDR memory device, a DDR2 memory device and a DDR3 memory device.

11. A memory system comprising:
- a memory module that includes a plurality of memory device; and
- a memory controller that transfers commands and addresses to the memory devices, and transfers/receives data from/to the memory devices, each of the memory devices comprising:
  - a memory cell array that includes a plurality of word lines, a plurality of column lines and a plurality of memory cells;
  - a row decoding section that decodes a row address in response to a first clock to activate one of the word lines corresponding to the decoded row address;
  - a K-bit prefetch section that decodes a column address, in response to a second clock for accessing the memory cell array, so as to prefetch K data from K memory cells of the memory cells that are connected to the activated word line corresponding to the decoded column address, wherein a frequency of the second clock is 1/M of a frequency of the first clock, M is a real number other than a 2's power and K is a natural number equal to or greater than 2; and
  - an output buffer section that outputs the K prefetched data as a data stream in response to a third clock.

12. The memory system of claim 11, wherein M is determined so that the frequency of the second clock is maintained lower than a frequency of a physical clock limit for the memory device to access the memory cell array.

13. The memory system of claim 12, wherein M is equal to 3.

14. The memory system of claim 12, wherein a frequency of the third clock is substantially equal to L times the second clock and L is a real number other than a 2's power.

15. The memory system of claim 11, wherein the memory device further comprises a frequency synthesizer that is configured to generate the second clock based on the first clock.

16. The memory system of claim 15, wherein the frequency synthesizer is configured to determine the frequency of the second clock based on information of a burst length of the memory device.

17. A method of inputting/outputting data into/from the memory device, the method comprising:
- activating a word line corresponding to a decoded row address decoded from a row address in response to a first clock;
- prefetching K data from memory cells that are connected to the activated word line corresponding to a decoded column address that is decoded from a column address in response to a second clock for accessing the memory cell array, wherein a frequency of the second clock is 1/M of a frequency of the first clock, M is a real number other than a 2's power and K is a natural number equal to or greater than 2; and
- outputting the K data as a data stream in response to a third clock.

18. The method of claim 17, wherein M is determined such that the frequency of the second clock is maintained lower than a physical clock limit for the memory device to access the memory cell array.

19. The method of claim 17, wherein a frequency of the third clock is substantially equal to L times the second clock and L is a real number other than a 2's power.

20. The method of claim 17 further comprising generating the second clock based on the first clock.

* * * * *